US008686281B2

United States Patent
Yuuya

(10) Patent No.: US 8,686,281 B2
(45) Date of Patent: *Apr. 1, 2014

(54) SEMICONDUCTOR DEVICE AND SOLAR BATTERY USING THE SAME

(75) Inventor: Shigenori Yuuya, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 21 days.

This patent is subject to a terminal disclaimer.

(21) Appl. No.: 13/263,609

(22) PCT Filed: Apr. 6, 2010

(86) PCT No.: PCT/JP2010/002510
§ 371 (c)(1),
(2), (4) Date: Oct. 7, 2011

(87) PCT Pub. No.: WO2010/116723
PCT Pub. Date: Oct. 14, 2010

(65) Prior Publication Data
US 2012/0017993 A1    Jan. 26, 2012

(30) Foreign Application Priority Data
Apr. 8, 2009    (JP) ................ 2009-093536

(51) Int. Cl.
*H01L 31/0224*    (2006.01)
*H01L 31/042*    (2006.01)

(52) U.S. Cl.
USPC ........... 136/251; 136/244; 136/256; 136/243; 438/64; 438/66; 438/67; 438/80

(58) Field of Classification Search
USPC .......... 136/256, 262, 249; 438/57, 84, 85, 95, 438/86, 65, 66, 98
See application file for complete search history.

(56) References Cited

U.S. PATENT DOCUMENTS

| 4,410,558 | A  | * | 10/1983 | Izu et al. ...................... 438/62 |
| 5,626,688 | A  |   | 5/1997  | Probst et al. |
| 5,714,391 | A  |   | 2/1998  | Omura et al. |
| 8,017,861 | B2 | * | 9/2011  | Basol ........................ 136/256 |
| 2005/0028861 | A1 |   | 2/2005 | Aoki et al. |
| 2010/0252110 | A1 | * | 10/2010 | Yago et al. .................. 136/261 |
| 2010/0300532 | A1 | * | 12/2010 | Cumpston et al. ........... 136/259 |

FOREIGN PATENT DOCUMENTS

| JP | 62089369    A | 4/1987 |
| JP | 7147416     A | 6/1995 |
| JP | 8222750     A | 8/1996 |
| JP | 9074065     A | 3/1997 |
| JP | 9074213     A | 3/1997 |
| JP | 2002241992  A | 8/2002 |

(Continued)

OTHER PUBLICATIONS

Pore-Filling of Porous Anodic Oxide Films on Aluminum; Takahashi, et al.; Fac. of Eng., Hokkaido Univ.

(Continued)

*Primary Examiner* — Jayne Mershon
(74) *Attorney, Agent, or Firm* — Sughrue Mion, PLLC

(57) ABSTRACT

A semiconductor device includes a semiconductor circuit on an insulated metal substrate, which includes an anodized film formed on at least one side of an Al substrate, wherein the Al substrate has a potential higher than an average potential of the semiconductor circuit when the semiconductor circuit is driven.

6 Claims, 5 Drawing Sheets

(56) References Cited

FOREIGN PATENT DOCUMENTS

| JP | 2003330249 A | 11/2003 |
|---|---|---|
| JP | 2006295035 A | 10/2006 |
| WO | 03069684 A1 | 8/2003 |
| WO | 2009041657 A1 | 4/2009 |

OTHER PUBLICATIONS

The Performance of Cu (In,Ga) Se2-Based Solar Cells in Conventional and Concentrator Applications; Tuttle, et al.; Mat. Res. Soc. Symp. Proc. vol. 426; 1996 Materials Research Society.

Fabrication of Cu(InGa)Se2 thin films by a combination of mechanochemical and screen-printing/sintering processes; Wada, et al; Wiley InterScience; 2006; phys. stat. sol. (a) 203, No. 11, 2593-2597.

Microstructural Characterization for Sputter-Deposited CuInSe2 Films and Photovoltaic Devices; Nakada; Jpn. J. App. Phys. vol. 34 (1995) pp. 4715-7421; Part 1, No. 9A, Sep. 1995.

Polycrystalline CuInSe2 Thin Films for Solar Cells by Three-Source Magnetron Sputtering; Nakada, et al; Jpn. J. Appl. Phys. vol. 32 (1993) pp. L1169-L1172; Part 2, No. 8B, Aug. 15, 1993.

Cds/CuInSe1 Junctions Fabricated by DC Magnetron Sputtering of Cu2Se and In2Se3; Ermer, et al.; Arco Solar, Inc.; Chatsworth, California; 0160-8371/85/0000-1655; @1985 IEEE.

Thin Films of CuInSe2 Produced by Thermal Annealing of Multilayers with Ultra-Thin Stacked Elemental Layers; Nakada, et al. Department of Electrical Engineering and Electronics; pp. 887-890.

CuInSe2-based solar cells by Se-vapor selenization from Se containing precursors; Nakada, et al.; Solar Energy Materials and Solar Cells 35 (1994) 209-214.

Growth of high-quality CuGaSe2 thin films using ionized Ga precursor; Miyazaki, et al.; Pys. Stat. Sol. (a) 203, No. 11, 2603-2608 (2006)/DOI 10,102/pssa.200669640; Interscience; 2006.

Aluminum Handbook, 4th edition, Japan Light Metal Association, pp. 1-5 and 219-221, 1990 along with an excerpt translation thereof.

\* cited by examiner

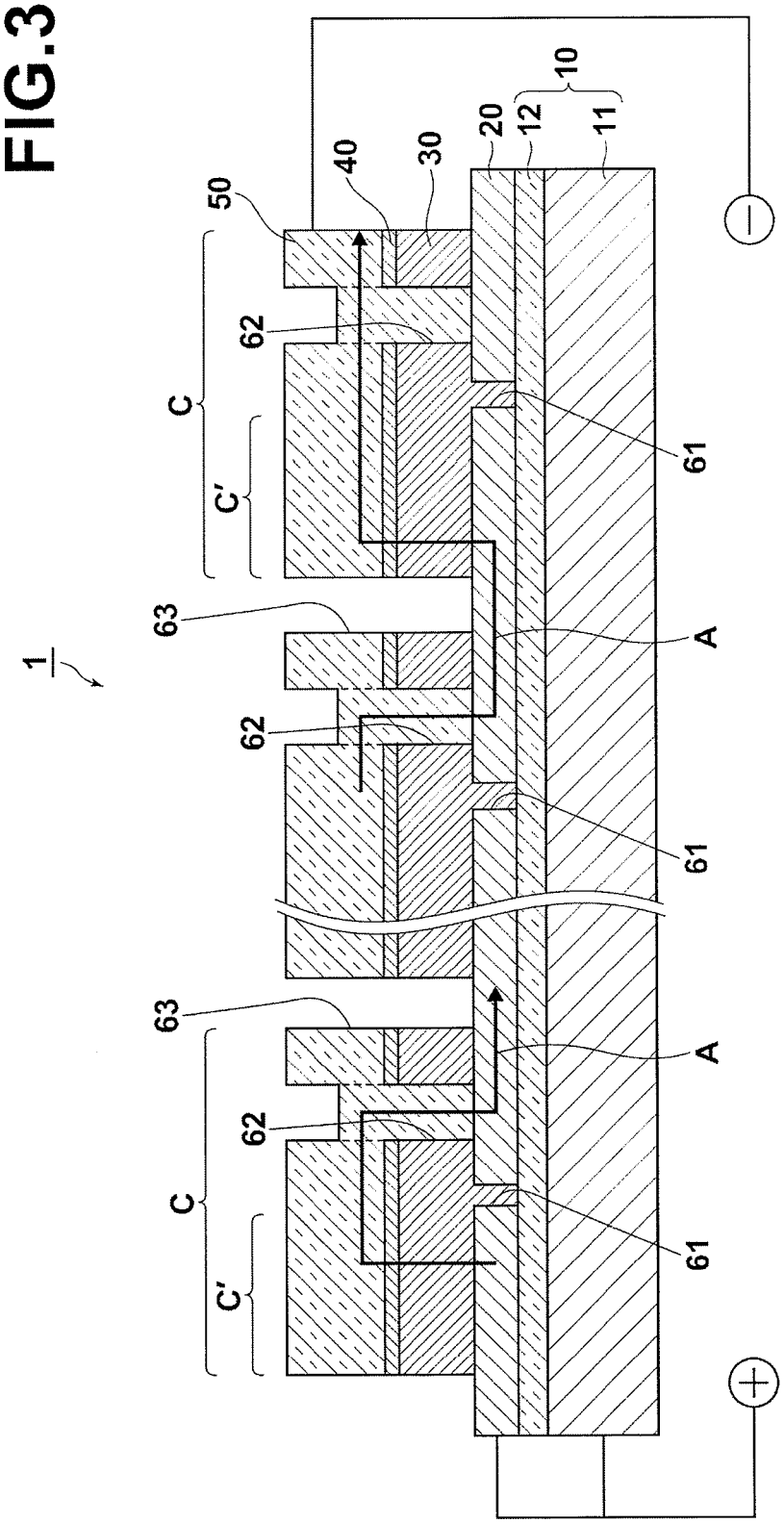

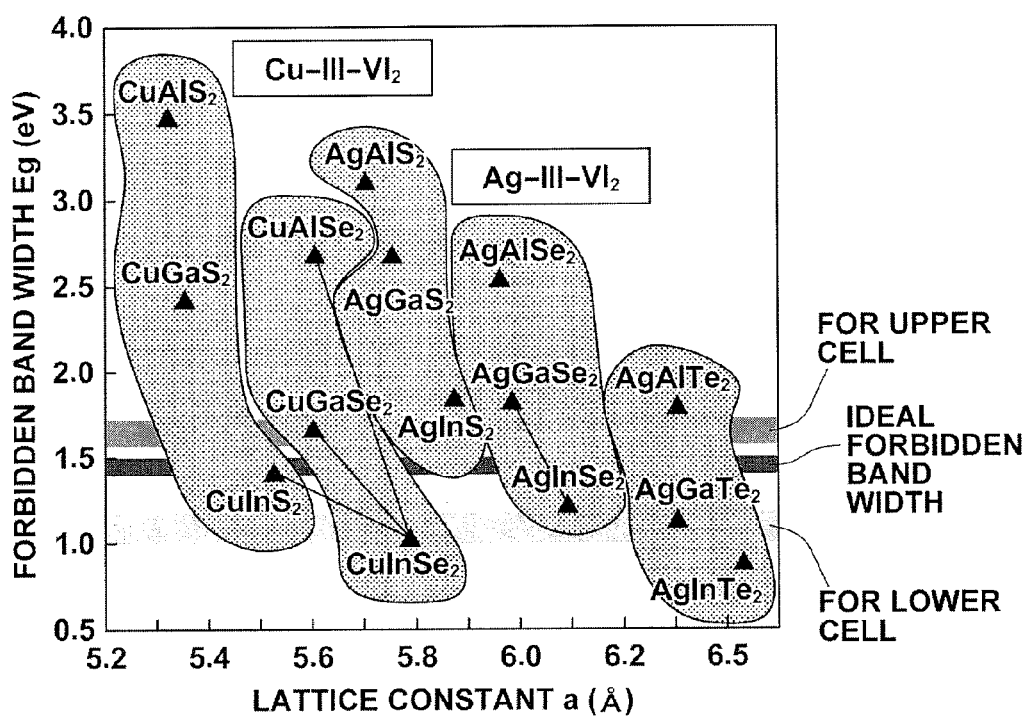

TRANSIENT ELECTRIC CURRENT CHARACTERISTICS
WHEN Al SUBSTRATE HAS NEGATIVE POLARITY (EXAMPLE 1)

TRANSIENT ELECTRIC CURRENT CHARACTERISTICS
WHEN Al SUBSTRATE HAS POSITIVE POLARITY (EXAMPLE 1)

TRANSIENT ELECTRIC CURRENT CHARACTERISTICS
WHEN Al SUBSTRATE HAS NEGATIVE POLARITY (EXAMPLE 2)

TRANSIENT ELECTRIC CURRENT CHARACTERISTICS
WHEN Al SUBSTRATE HAS POSITIVE POLARITY (EXAMPLE 2)

SEMICONDUCTOR DEVICE AND SOLAR BATTERY USING THE SAME

CROSS REFERENCE TO RELATED APPLICATION

This application is a National Stage of International Application No. PCT/JP2010/002510 filed Apr. 6, 2010, claiming priority based on Japanese Patent Application No. 2009-093536, filed Apr. 8, 2009, the contents of all of which are incorporated herein by reference in their entirety.

TECHNICAL FIELD

The present invention relates to a semiconductor device including a semiconductor circuit on a metal substrate with an anodized film serving as an insulating layer, and a solar battery using the semiconductor device.

BACKGROUND ART

Solar batteries have recently become an active area of research, and improvements have been made from various points of view. A solar battery includes a semiconductor circuit, which is formed by a number of solar cells connected in series, formed on a substrate. Each solar cell has a multi-layer structure, in which a photoelectric conversion layer, which is a semiconductor to generate an electric charge when absorbing light, is disposed between a lower electrode (back electrode) and an upper electrode (transparent electrode).

Conventionally, glass substrates have been used as the substrates in the solar batteries. However, it has been considered to use a flexible metal substrate. A solar battery using a metal substrate has possibility of wider applicability than a solar battery using a glass substrate, because of lightweight and flexibility of the substrate. Further, since the metal substrate is tolerable to a high temperature process, it is expected to provide a solar battery with improved photoelectric conversion characteristics and higher efficiency. However, since the semiconductor circuit, which conducts the photoelectric conversion, of the solar battery is disposed on the substrate, it is necessary to provide an insulating layer between the substrate and the semiconductor circuit when the metal substrate is used.

For example, in a case where the substrate is made of an iron-based material, such as stainless steel, it is known to form the insulating layer by coating an oxide of Si or Al through a gas-phase process, such as CVD (Chemical Vapor Deposition), or a liquid-phase process, such as sol-gel method. However, in general, these types of film forming processes tend to produce pin holes and/or cracking, and this is an essential problem for a process which is used to stably form the insulating layer having a large area.

In a case where the metal substrate is made of aluminum (Al), a good insulating coating with good adhesion is provided by forming an anodized coating on the surface of the Al substrate. However, although the anodized coating has good adhesion, its insulation performance is insufficient, and thus still should be improved to be used as the insulating layer of a solar battery, etc.

With respect to the metal substrate for the solar battery described-above, the maximum voltage generated by each solar cell is about 0.65 V, and 100 or more solar cells are connected in series on a single substrate to form a module circuit. Therefore, considering safety and long-term reliability, the insulating layer on the metal substrate needs to have a withstand voltage of not less than 500 V. Further, it is important that the insulating layer has a high resistance value since a leakage current at the insulating layer is a factor of degradation of solar light-electric power conversion efficiency of the solar battery module.

The anodized film, however, typically has poor insulation performance. There are some known examples of improvement of the insulation performance of the anodized film formed on the surface of the Al substrate. Specifically, a method where an insulating layer is additionally formed on the anodized film (see Japanese Unexamined Patent Publication No. 7(1995)-147416), a method where an intermetallic compound in the anodized film is prescribed (see Japanese Unexamined Patent Publication No. 2002-241992), a method where the thickness of a barrier layer (a thin and dense oxide layer present in the vicinity of the interface between the anodized film and Al) is increased through a pore filling method (see Japanese Unexamined Patent Publication No. 2003-330249, and H. Takahashi and M. Nagayama, "Pore-Filling of Porous Anodic Oxide Films on Aluminium", Journal of the Metal Finishing Society of Japan, Vol. 27, No. 7, pp. 338-343, 1976) have been reported.

Insulation performance factors of the insulating layer include withstand voltage and leakage current, and a withstand voltage as high as possible and a leakage current as small as possible are desirable. Although the above-mentioned prior-art methods improve these insulation performance factors, these methods are not related to solar batteries, and are to improve the insulation performance of anodized films in general. Therefore, a novel method, other than these methods, which can improve the insulation performance of the anodized film of the Al substrate of the solar battery is desired.

DISCLOSURE OF INVENTION

To meet the above-described demand, the present invention is directed to providing a semiconductor device using an insulated metal substrate including an anodized film formed on an Al substrate, which has a high withstand voltage and reduced variation of leakage current, thereby achieving good insulation characteristics, as well as a solar battery using the semiconductor device, without using the above-described prior art techniques.

The present inventor has found with respect to the insulation characteristics of the anodized film that, when a voltage is applied so as to provide the Al substrate with the positive polarity, a larger withstand voltage and smaller variation of leakage are provided than those when a voltage is applied to provide the Al substrate with the negative polarity, thereby achieving the present invention.

Namely, the semiconductor device according to the invention is a semiconductor device including a semiconductor circuit on an insulated metal substrate, the insulated metal substrate including an anodized film formed on at least one side of an Al substrate, wherein the Al substrate is connected to a site of the semiconductor circuit having a higher potential than an average potential of the semiconductor circuit.

The "Al substrate" herein refers to a metal substrate composed mainly of Al, and more specifically, a metal substrate with an Al content of not less than 90% by mass. The Al substrate may be a pure Al substrate, which may contain a trace element, or an alloy substrate of Al and a different metal element. Further, a "main component" of each layer (a lower electrode, a photoelectric conversion layer, an upper electrode, and other optional layers provided as necessary)

formed on the insulated metal substrate is defined to be a component which is contained in an mount of at least 75% by mass.

The "semiconductor circuit" herein refers to an electronic circuit which includes a semiconductor and a pair of electrodes disposed on opposite sides of the semiconductor.

The "average potential of the semiconductor circuit" herein refers to a median of a designed maximum voltage of the semiconductor device, and is equal, for example, to a potential of a cell at an midpoint of an electronic circuit formed by a number of identical photoelectric conversion elements (solar cells) connected in series, which are uniformly exposed to solar light and generate an electric current. For example, if a total output voltage of the solar cells connected in series is 100 V, the average potential is 50 V.

Further, the "connection" of the "Al substrate connected to a site of the semiconductor circuit having a higher potential than an average potential of the semiconductor circuit" is not limited to direct short-circuit of the Al substrate with a site, such as an electrode, of the circuit, but also refers to indirect connection, such as connection via an electric resistance or another battery. That is, any manner of connection may be employed, as long as a high potential of the Al substrate is provided and an electric field polarity that provides the Al substrate with the positive polarity is applied to the insulating anodized film formed between the substrate and the semiconductor.

In the semiconductor device according to the invention, the Al substrate is connected to a site of the semiconductor circuit having a higher potential than an average potential of the semiconductor circuit, as described above. More preferably, the Al substrate may be short-circuited with a site of the semiconductor circuit having a highest potential when the semiconductor circuit is driven. In this aspect, a voltage with an electric field polarity that provides the Al substrate with the positive polarity can always be applied to the anodized film.

The "site having a highest potential" herein refers to a site of the semiconductor device which has a designed maximum voltage of the positive polarity. In a case of the solar battery, for example, the site is a positive electrode of a cell at the end on the positive polarity side among the number of cells connected in series.

The semiconductor device according to the invention with the increased insulation performance of the anodized film disposed between the Al substrate and the semiconductor circuit can be used in various applications. In particular, the semiconductor device according to the invention can be implemented as a photoelectric conversion device, in which the semiconductor of the semiconductor circuit is a photoelectric conversion semiconductor which generates an electric charge when absorbing light.

In this case, a main component of the photoelectric conversion semiconductor may preferably be at least one compound semiconductor having a chalcopyrite structure, and more preferably be at least one compound semiconductor containing a group Ib element, a group IIIb element and a group VIb element.

Further, the main component of the photoelectric conversion semiconductor may preferably be at least one compound semiconductor containing:
at least one group Ib element selected from the group consisting of Cu and Ag;
at least one group IIIb element selected from the group consisting of Al, Ga and In; and
at least one group VIb element selected from the group consisting of S, Se and Te.

The description of element groups herein are based on the short-period form of the periodic table. The compound semiconductor containing a group Ib element, a group IIIb element and a group VIb element may herein be referred to as a "group I-III-VI semiconductor". The group Ib element, the group IIIb element, and the group VIb element forming the group I-III-VI semiconductor may respectively be one or two or more elements.

The semiconductor device forming the photoelectric conversion device according to the invention, which includes the above-described photoelectric conversion semiconductor, is suitable for a solar battery, and can form a solar battery without any modification. Namely, the solar battery according to the invention is characterized by including the above-described semiconductor device.

EFFECT OF INVENTION

The semiconductor device and the solar battery using the semiconductor device according to the invention are formed by a semiconductor device including a semiconductor circuit on an insulated metal substrate, which includes an anodized film formed on at least one side of an Al substrate, wherein the Al substrate is connected to a site of the semiconductor circuit having a higher potential than an average potential of the semiconductor circuit. Therefore, the Al substrate of the semiconductor device has a higher potential than the average potential of the semiconductor circuit when the semiconductor circuit is driven, that is, a voltage is applied to provide the Al substrate with the positive polarity. This provides a higher withstand voltage of the anodized film than that when a voltage is applied so as to provide the Al substrate with the negative polarity, and a reduced leakage current, thereby providing very high insulation performance. Although details of the cause of this phenomenon is unclear at present, it is believed to be self-repairing of defects in the barrier layer, as will be described later.

BRIEF DESCRIPTION OF DRAWINGS

FIG. 3 is a schematic sectional view illustrating an example of wiring of a solar battery module according to one embodiment of the invention, FIG. 4 is a graph showing a relationship between a lattice constant and a bandgap of I-III-VI compound semiconductors;

BEST MODE FOR CARRYING OUT THE INVENTION

Figure 1:
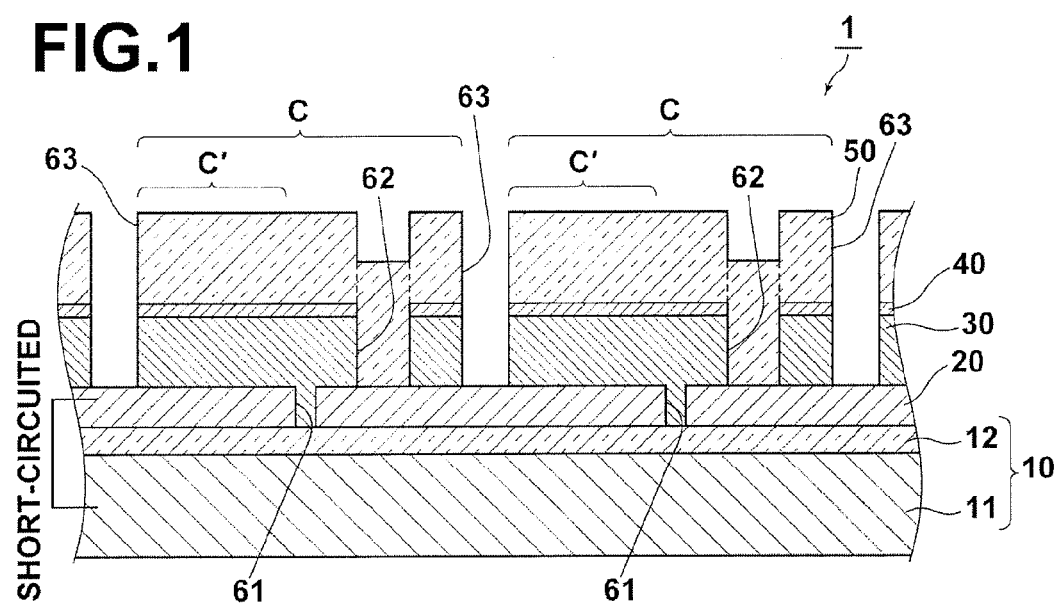
FIG. 1 is a schematic sectional view of a semiconductor device according to one embodiment of the invention.

Hereinafter, embodiments of the present invention will be described with reference to the drawings; however, the invention is not limited to the specific embodiments. It should be noted that constituent elements shown in the drawings are not to scale for ease of visual understanding.

Embodiment of Semiconductor Device

Figure 2:
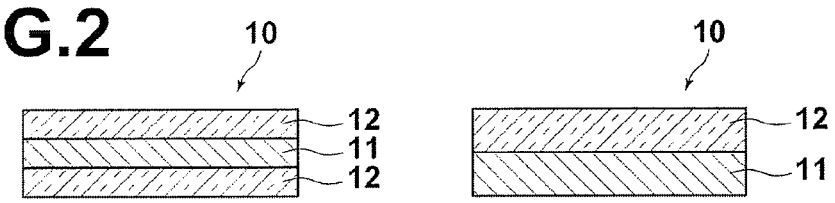
FIG. 2 is an enlarged schematic sectional view illustrating the structure of a metal substrate including an anodized film serving as an insulating layer.

Now, the structure of a semiconductor device according to an embodiment of the invention is described with reference to the drawings. The semiconductor device of this embodiment is a photoelectric conversion device including a semiconductor which is a photoelectric conversion semiconductor. FIG. 1 is a schematic sectional view of the photoelectric conversion device, and FIG. 2 is a schematic sectional view illustrating the structure of an insulated metal substrate.

The photoelectric conversion device 1 includes, on the insulated metal substrate 10, a lower electrode (back electrode) 20, a photoelectric conversion semiconductor 30, a buffer layer 40 and an upper electrode (transparent electrode) 50, which are formed in layers in this order. In this embodiment, as shown in FIG. 1, the lower electrode (back electrode) 20, the photoelectric conversion semiconductor 30, the buffer layer 40 and the upper electrode (transparent electrode) 50 form a semiconductor circuit, which uses the photoelectric conversion function of the photoelectric conversion semiconductor. The photoelectric conversion semiconductor is hereinafter referred to as a "photoelectric conversion layer".

The photoelectric conversion device 1 include, as can be seen in the sectional view, first grooves 61 running only through the lower electrode 20, second grooves 62 running through the photoelectric conversion layer 30 and the buffer layer 40, and third grooves 63 running through the photoelectric conversion layer 30, the buffer layer 40 and the upper electrode 50.

In the above-described arrangement, the first to third grooves 61 to 63 provide a structure in which the device is partitioned into a number of elements C. Further, with the upper electrode 50 filled in the second grooves 62, a structure in which the upper electrode 50 of a certain element C is connected in series to the lower electrode 20 of an adjacent element C is provided. That is, the semiconductor circuit of this embodiment forms an integrated circuit which includes the number of elements (cells) partitioned with the grooves and electrically connected in series so that voltages generated by these elements are added together. In this structure, each area C' forms the effective area of the photoelectric conversion function.

Insulated Metal Substrate

In this embodiment, the insulated metal substrate 10 is a substrate obtained by anodizing at least one side of an Al substrate 11. That is, the insulated metal substrate 10 includes an anodized film 12 formed through anodization and the Al substrate 11 which is not anodized. The lower electrode, the photoelectric conversion layer and the upper electrode of the photoelectric conversion device is formed on the anodized film 12 serving as an insulating layer.

The insulated metal substrate 10 may have two anodized films 12 formed on the opposite sides of the Al substrate 11, as shown on the left in FIG. 2, or may have one anodized film 12 formed on one side of the Al substrate 11, as shown on the right in FIG. 2. In order to prevent warping due to a difference in the coefficient of thermal expansion between the Al substrate 11 and the anodized film 12 or cracking of the anodized film during a process of production of the photoelectric conversion device, it is preferred to form two anodized films 12 on the opposite sides of the Al substrate 11, as shown on the left in FIG. 2.

The Al substrate 11 may be made of a 1000-series pure aluminum according to Japanese Industrial Standards (JIS), or may be made of an Al alloy, such as Al—Mn alloy, Al—Mg alloy, Al—Mn—Mg alloy, Al—Zr alloy, Al—Si alloy or Al—Mg—Si alloy (see Aluminum Handbook (in Japanese), 4th edition, Japan Light Metal Association, pp. 1-5 and 219-221, 1990). The Al substrate 11 may contain any of various trace metal elements, such as Fe, Si, Mn, Cu, Mg, Cr, Zn, Bi, Ni and Ti.

The thickness of the Al substrate 11 may be selected as appropriate from the viewpoint of strength of the entire semiconductor device; however, the thickness in the form of the insulated metal substrate 10 is in the range from 0.1 to 10 mm. When the insulated metal substrate 10 is produced, it is necessary to determine the thickness of the Al substrate 11 with taking into account losses in the thickness due to the anodization and preliminarily washing and polishing carried out before the anodization.

Further, aluminum typically is softer and has larger linear expansion coefficient than other metals. Therefore, in order to increase the strength and provide thermal expansion that is consistent with thermal expansion at the semiconductor circuit area, the metal substrate may be formed by a multilayer metal substrate of Al and a metal having a smaller linear expansion coefficient than Al, and the insulated metal substrate may include an anodized film formed on the Al surface of the multilayer metal substrate.

The anodization is achieved by immersing the Al substrate 11, which serves as an anode, with a cathode in an electrolytic solution, and applying a voltage between the anode and the cathode. For the anodization, the surface of the Al substrate 11 may be subjected to a washing treatment and/or a polishing/smoothing treatment, as necessary. As the cathode, carbon or Al, for example, is used. The electrolyte is not particularly limited, and a preferred example thereof may be an acidic electrolytic solution containing one or two or more acids, such as sulfuric acid, phosphoric acid, chromic acid, oxalic acid, sulfamic acid, benzenesulfonic acid and/or amidosulfonic acid. Anodization conditions depend on the type of the electrolyte used, and are not particularly limited. For example, suitable anodization conditions may be as follows: an electrolyte concentration in the range from 1 to 80% by mass, a solution temperature in the range from 5 to 70 degrees C., an electric current density in the range from 0.005 to 0.60 $A/cm^2$, a voltage in the range from 1 to 200 V, and an electrolysis time in the range from 3 to 500 minutes. Preferred examples of the electrolyte may include sulfuric acid, phosphoric acid, oxalic acid, or a mixture thereof. When such an electrolyte is used, the electrolyte concentration may preferably be in the range from 4 to 30% by mass, the solution temperature may preferably be in the range from 10 to 30 degrees C., the electric current density may preferably be in the range from 0.05 to 0.30 $A/cm^2$, and the voltage may preferably be in the range from 30 to 150 V.

When the Al substrate 11 is anodized, the oxidation reaction progresses in a substantially vertical direction from the surface to form the anodized film 12. In a case where the above-described acidic electrolytic solution is used, the formed anodized film 12 has a number of closely-packed fine columnar bodies, each having a regular hexagon shape in plan view, and each fine columnar body has a micropore at the center thereof and a rounded bottom surface. A barrier layer (typically having a thickness in the range from 0.02 to 0.1 um) is formed at the bottom of the fine columnar bodies. It should be noted that, if the electrolysis is carried out using a neutral electrolytic solution, such as boric acid, a dense anodized film can be provided, unlike the anodized film formed by the porous fine columnar bodies obtained using the acidic electrolytic solution. Further, in order to increase the thickness of the barrier layer, pore filling may be carried out by carrying out another electrolysis using the neutral electrolytic solution after the porous anodized film has been formed using the acidic electrolytic solution.

The thickness of the anodized film 12 is not particularly limited, as long as insulation performance and a surface hardness enough to prevent damages due to mechanical shock during handling are provided. If the thickness is too large, a problem of flexibility may arise. In this view, a preferred thickness is in the range from 0.5 to 50 um. The thickness can be controlled by the electrolysis time with constant-current electrolysis or constant-voltage electrolysis.

The present inventor has found with respect to the insulation characteristics of the anodized film 12 of the insulated metal substrate 10 that, when a voltage is applied to the anodized film 12 so as to provide the Al substrate 11 of the insulated metal substrate 10 with the positive polarity, a larger withstand voltage and a significantly higher insulation performance are provided than those when a voltage is applied to provide the Al substrate 11 with the negative polarity. Although the cause of this phenomenon is unclear at present, it is probably that thick film growth of the barrier layer progresses with self-repairing defects in the barrier layer. That is, when a voltage is applied to provide the Al substrate 11 with the positive polarity, the electric field concentrates on electrically-weak defect portions of the barrier layer, and the anodization phenomenon preferentially occurs around the defect portions. This causes preferential self-repairing of the defects, and thus the barrier layer without defects grows as the time elapses. It should be noted that, with an Al electrolysis capacitor with high withstand voltage, it is said that self-repairing of defects occurs while it is used as a capacitor.

As the technique to increase the thickness of the barrier layer, a pore filling method, as disclosed in H. Takahashi and M. Nagayama, "Pore-Filling of Porous Anodic Oxide Films on Aluminium", Journal of the Metal Finishing Society of Japan, Vol. 27, No. 7, pp. 338-343, 1976), for example, is well known. This method provides a thick barrier layer by forming a porous anodized film through electrolysis in an acidic electrolytic solution, and then, carrying out electrolysis again with immersing the porous anodized film in a neutral electrolytic solution. The invention largely differs from this technique in that the invention does not require the second electrolysis, and that the barrier layer can be grown even after the semiconductor device has been completed.

On the basis of this phenomenon, the photoelectric conversion device according to this embodiment is configured such that, when the photoelectric conversion device is driven, the Al substrate 11 of the insulated metal substrate 10 has a higher potential than the average potential of the semiconductor circuit. For example, as shown in FIG. 1, the Al substrate 11 is short-circuited with the lower electrode 20, which has a higher potential than the average potential of the semiconductor circuit. With this configuration, an area of the Al substrate 11 having the positive polarity is increased with respect to the semiconductor circuit, thereby achieving good insulation characteristics only with the anodized film 12.

Further, it is preferred that the Al substrate 11 of the insulated metal substrate 10 is short-circuited with a portion of the semiconductor circuit which has a highest potential when driven. For example, FIG. 3 is a schematic sectional view illustrating an example of wiring of a solar battery module using the photoelectric conversion device of this embodiment. The solar battery module shown in FIG. 3 is configured such that electrons flow as indicated by arrow A. Therefore, as shown in FIG. 3, the Al substrate 11 is short-circuited with the lower electrode 20, which has the highest potential. With this configuration, a potential not less than the potential of the semiconductor circuit is provided over the entire area of the Al substrate 11, thereby achieving good insulation characteristics only with the anodized film 12.

It should be noted that the structure shown in FIG. 3 is only intended to facilitate understanding of the repeated series connection structure. Those skilled in the art will appreciate that the negative extraction electrode may be connected to the upper electrode 50, as shown in the drawing, or may be connected to the lower electrode 20 located below the groove 62.

The site with which the Al substrate 11 is short-circuited is not limited to the lower electrode. The Al substrate 11 may be short-circuited with the upper electrode, for example. Further, the site with which the Al substrate 11 is short-circuited may be an element which has the highest voltage when driven among the photoelectric conversion elements C, which are formed by partitioning, and in particular, may be an electrode (the lower electrode or the upper electrode) of the element. The short circuit may be achieved by connecting the sites of the Al substrate 11 and the lower electrode 20 to be short-circuited via wiring, or by forming a pin hole in the anodized film 12 to connect the Al substrate 11 with the lower electrode 20.

Photoelectric Conversion Layer

The photoelectric conversion layer 30 generates an electric charge when it absorbs light. The main component of the photoelectric conversion layer 30 is not particularly limited; however, it may preferably be at least one compound semiconductor having a chalcopyrite structure. The main component of the photoelectric conversion layer 30 may preferably be at least one compound semiconductor containing a group Ib element, a group IIIb element and a group VIb element.

In view of providing high light absorptance and high photoelectric conversion efficiency, the main component of the photoelectric conversion layer 30 may preferably be at least one compound semiconductor that contains:
at least one group Ib element selected from the group consisting of Cu and Ag;
at least one group IIIb element selected from the group consisting of Al, Ga and In; and
at least one group VIb element selected from the group consisting of S, Se and Te.
Examples of the compound semiconductor may include:
$CuAlS_2$, $CuGaS_2$, $CuInS_2$,
$CuAlSe_2$, $CuGaSe_2$, $CuInSe_2$ (CIS),
$AgAlS_2$, $AgGaS_2$, $AgInS_2$,
$AgAlSe_2$, $AgGaSe_2$, $AgInSe_2$,
$AgAlTe_2$, $AgGaTe_2$, $AgInTe_2$,
$Cu(In_{1-x}Ga_x)Se_2$ (CIGS), $Cu(In_{1-x}Al_x)Se_2$, $Cu(In_{1-x}Ga_x)(S,Se)_2$,
$Ag(In_{1-x}Ga_x)Se_2$, and $Ag(In_{1-x}Ga_x)(S,Se)_2$.

It is particularly preferred that the photoelectric conversion layer 30 contains $CuInSe_2$ (CIS) and/or $Cu(In,Ga)Se_2$ (CIGS), which is obtained by adding Ga to $CuInSe_2$(CIS) to provide a solid solution. CIS and CIGS are semiconductors having a chalcopyrite crystal structure and high light absorptance, and is reported to have high photoelectric conversion efficiency. Further, they are less susceptible to deterioration of efficiency due to exposure to light and have excellent durability.

The photoelectric conversion layer 30 contains an impurity to provide a desired semiconductor conductivity type. The impurity can be added to the photoelectric conversion layer 30 by diffusion from an adjacent layer and/or actively by doping. In the photoelectric conversion layer 30, the constituent elements and/or the impurity of the group I-III-VI semiconductor may have a distributed concentration, or may include layer areas having different types of semiconductivity, such as n-, p- and i-types. For example, in the CIGS system, when the Ga content in the photoelectric conversion layer 30 is distributed in the thickness direction, the width of the bandgap, the mobility of the carrier, etc., can be controlled, thereby achieving a design which provides high photoelectric conversion efficiency. The photoelectric conversion layer 30 may contain one or two or more semiconductors other than the group I-III-VI semiconductor. Examples of the semiconductor other than the group I-III-VI semiconductor may include: a semiconductor made of a group IVb element (group IV semiconductor), such as Si; a semiconductor made of a group IIIb element and a group Vb element (group III-V semiconductor), such as GaAs; and a semiconductor made of a group IIb element and a group VIb element (group II-VI semiconductor), such as CdTe. The photoelectric conversion layer 30 may contain any optional component other than the semiconductor and the impurity to provide a desired conductivity type, as long as no adverse effect is exerted to properties of the photoelectric conversion layer 30. The content of the group I-III-VI semiconductor in the photoelectric conversion layer 30 is not particularly limited; however, the content of the group I-III-VI semiconductor may preferably be not less than 75% by mass, more preferably be not less than 95% by mass, and particularly preferably be not less than 99% by mass.

Known processes usable to form the CIGS layer may include: 1) a simultaneous multi-source deposition process (J. R. Tuttle et al., "The Performance of Cu (In, Ga) $Se_2$-Based Solar Cells in Conventional and Concentrator Applications", Mat. Res. Soc. Symp. Proc. Vol. 426, pp. 143-151, 1996, H. Miyazaki et al., "Growth of high-quality $CuGaSe_2$ thin films using ionized Ga precursor", phys. stat. sol. (a), Vol. 203, pp. 2603-2608, 2006, etc.); 2) a selenation process (T. Nakada et al., "$CuInSe_2$-based solar cells by Se-vapor selenization from Se-containing precursors", Solar Energy Materials and Solar Cells, Vol. 35, pp. 209-214, 1994, and T. Nakada et al., "THIN FILMS OF $CuInSe_2$ PRODUCED BY THERMAL ANNEALING OF MULTILAYERS WITH ULTRA-THIN STACKED ELEMENTAL LAYERS", Proceedings of the 10th European Photovoltaic Solar Energy Conference (EU PVSEC), pp. 887-890, 1991, etc.); 3) a sputtering process (J. H. Ermer et al., "$CdS/CuInSe_2$ JUNCTIONS FABRICATED BY DC MAGNETRON SPUTTERING OF $Cu_2Se$ AND $In_2Se_3$", Proceedings of the 18th IEEE Photovoltaic Specialists Conference, pp. 1655-1658, 1985, and T. Nakada et al., "Polycrystalline $CuInSe_2$ Thin Films for Solar Cells by Three-Source Magnetron Sputtering", Japanese Journal of Applied Physics, Vol. 32, Part 2, No. 8B, pp. L1169-L1172, 1993, etc.); 4) a hybrid sputtering process (T. Nakada et al., "Microstructural Characterization for Sputter-Deposited $CuInSe_2$ Films and Photovoltaic Devices", Japanese Journal of Applied Physics, Vol. 34, Part 1, No. 9A, pp. 4715-4721, 1995, etc.); and 5) a mechanochemical process (T. Wada et al., "Fabrication of $Cu(In,Ga)Se_2$ thin films by a combination of mechanochemical and screen-printing/sintering processes", Physica status solidi (a), Vol. 203, No. 11, pp. 2593-2597, 2006, etc.). Other processes usable to form the CIGS layer may include screen printing, close-space-sublimation technique, MOCVD and spraying. For example, a crystal having a desired composition can be provided by forming a particulate film containing the group Ib element, the group IIIb element and the group VIb element on the substrate through screen printing or spraying, and applying a thermal decomposition treatment (which may be carried out in the atmosphere of the group VIb element) (see Japanese Unexamined Patent Publication Nos. 9(1997)-074065, 9(1997)-074213, etc.)

FIG. 4 is a graph showing a relationship between a lattice constant and a bandgap of main I-III-VI compound semiconductors. Various forbidden band widths (bandgaps) can be obtained by changing the composition ratio. When photons with energy larger than the bandgap enter the semiconductor, a part of the energy exceeding the bandgap becomes a heat loss. It has been known through a theoretical calculation that a bandgap of about 1.4 to 1.5 eV provides the maximum conversion efficiency for a combination of the spectrum of the solar light and the bandgap. In order to increase the photoelectric conversion efficiency, for example, the Ga concentration in $Cu(In,Ga)Se_2$ (CIGS) may be increased, the Al concentration in $Cu(In,Al)Se_2$ may be increased, or the S concentration in $Cu(In,Ga)(S,Se)_2$ may be increased to increase the bandgap, thereby achieving a bandgap with high conversion efficiency. In the case of CIGS, the bandgap can be adjusted in the range from 1.04 to 1.68 eV.

Electrode and Buffer Layer

Each of the lower electrode (back electrode) 20 and the upper electrode (transparent electrode) 50 is made of a conductive material. The upper electrode 50 on the light-incident side needs to be translucent.

For example, Mo can be used as the material forming the lower electrode 20. The thickness of the lower electrode 20 may preferably be not less than 100 nm, and more preferably be in the range from 0.45 to 1.0 um. The process used to form the lower electrode 20 is not particularly limited, and examples thereof may include gas-phase film forming processes, such as electron beam deposition and sputtering. As the main component of the upper electrode 50, ZnO, ITO (indium tin oxide), $SnO_2$ or a combination thereof is preferred. The upper electrode 50 may have a single-layer structure, or may have a multi-layer structure, such as a double-layer structure. The thickness of the upper electrode 50 is not particularly limited; however, the thickness of the upper electrode 50 may preferably be in the range from 0.3 to 1 um. For the buffer layer 40, CdS, ZnS, ZnO, ZnMgO, ZnS(O,OH) or a combination thereof is preferred.

An example of a combination of preferred compositions is: a Mo lower electrode/a CIGS photoelectric conversion layer/a CdS buffer layer/a ZnO upper electrode.

In a photoelectric conversion device using a soda lime glass substrate, it is reported that an alkali metal element (Na element) in the substrate diffuses into the CIGS film to provide high photoelectric conversion efficiency. In this embodiment, diffusing the alkali metal in the CIGS film is preferred. Examples of the method for diffusing the alkali metal element may include: forming a layer containing the alkali metal element on the Mo lower electrode through vapor deposition or sputtering (Japanese Unexamined Patent Publication No. 8(1996)-222750, for example); forming an alkali layer containing $Na_2S$, etc., on the Mo lower electrode through dipping (International Patent Publication No. WO03/069684, for example); forming a precursor containing In, Cu and Ga metal elements on the Mo lower electrode, and then putting an aqueous solution containing, for example, sodium molybdate, on the precursor.

In addition, a structure in which a layer containing one or two or more alkali metal compounds, such as $Na_2S$, $Na_2Se$, NaCl, NaF and/or sodium molybdate, provided in the lower electrode 20 may be preferred.

The conductivity types of the layer from the photoelectric conversion layer 30 to the upper electrode 50 are not particularly limited. Typically, the photoelectric conversion layer 30 may be a p-layer, the buffer layer 40 may be an n-layer (such as an n-CdS layer), and the upper electrode 50 may be an n-layer (such as an n-ZnO layer) or a multi-layer structure of an i-layer and an n-layer (such as an i-ZnO layer and an n-ZnO layer). With these conductivity types, it is believed that a p-n junction or a p-i-n junction is formed between the photoelectric conversion layer 30 and the upper electrode 50. Further, it is believed that, when the buffer layer 40 provided on the photoelectric conversion layer 30 is made of CdS, Cd diffuses to form an n-layer on the surface of the photoelectric conversion layer 30, and a p-n junction is formed in the photoelectric conversion layer 30. An i-layer might be provided under the n-layer of the photoelectric conversion layer 30 to form a p-i-n junction in the photoelectric conversion layer 30.

Other Layers

The photoelectric conversion device 1 may include any optional layer other than the above-described layers, as necessary. For example, an adhesion layer (buffer layer) to increase adhesion between the layers may be provided, as necessary, between the insulated metal substrate 10 and the lower electrode 20, and/or between the lower electrode 20 and the photoelectric conversion layer 30. Further, an alkali barrier layer for preventing diffusion of an alkali ion may be provided, as necessary, between the insulated metal substrate 10 and the lower electrode 20. See Japanese Unexamined Patent Publication No. 8(1996)-222750 for the alkali barrier layer.

The photoelectric conversion device 1 according to this embodiment is preferably applicable to solar batteries, and the like. By attaching a cover glass, a protective film, etc., to the photoelectric conversion device 1, as necessary, a solar battery can be formed. Further, the semiconductor device according to the invention is not limited to the photoelectric conversion device as described above. That is, the semiconductor device according to the invention is applicable not only to the vertical semiconductor device described in this embodiment, but also applicable to a lateral semiconductor device. Specifically, for example, the semiconductor device according to the invention is applicable to a flexible transistor, etc. Moreover, the semiconductor device according to the invention is applicable not only to the DC semiconductor device, but also to an AC semiconductor device. It is preferred that, even when an AC semiconductor device is used, the potential of the Al substrate higher than the highest potential of the semiconductor circuit is provided.

EXAMPLES

Now, examples of the semiconductor device according to the invention and comparative examples are described.

Example 1

The surface of a commercially-available high-purity Al plate (purity level: 4N) was subjected to ultrasonic washing with ethanol, and was subjected to electrolysis polishing with a mixed solution of acetic acid and perchloric acid. Then, the Al plate was subjected to constant voltage electrolysis at 40 V in a 80 g/L oxalic acid solution to form a 10 um-thick anodized film on the surface of the Al plate.

Example 2

A 10 um-thick anodized film was formed on the surface of a commercially-available JIS 1080 grade Al plate (purity: 99.8%) in the same manner as in Example 1.

Measurement of Insulation Performance

A positive voltage and a negative voltage were applied to each of the Al substrates obtained in the above-described examples to measure a leakage current for each polarity. A 0.2 um-thick Au electrode having a diameter of 3.5 mm was provided through masked vapor deposition on the anodize surface, and a constant voltage was applied to the Au electrode to measure a temporal change (transient characteristics) of the leakage current. The electric current was measured for 60 seconds with an interval of about one second. A value obtained by dividing the leakage electric current with an area of the Au electrode (9.6 mm$^2$) was used as a leakage current density.

Evaluation

Figure 5A:
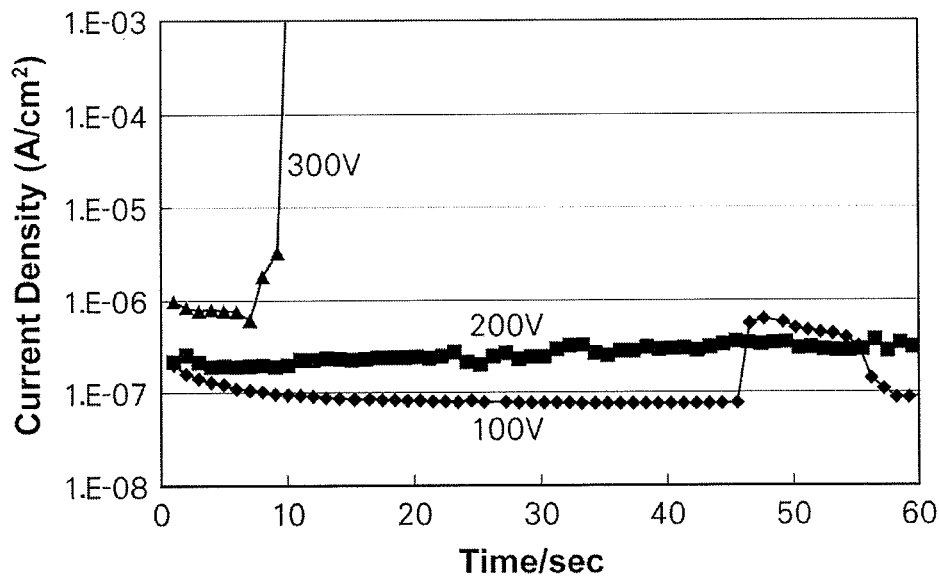
FIG. 5A is a graph showing transient electric current characteristics of an Al substrate of Example 1 having the negative polarity.
Figure 5B:
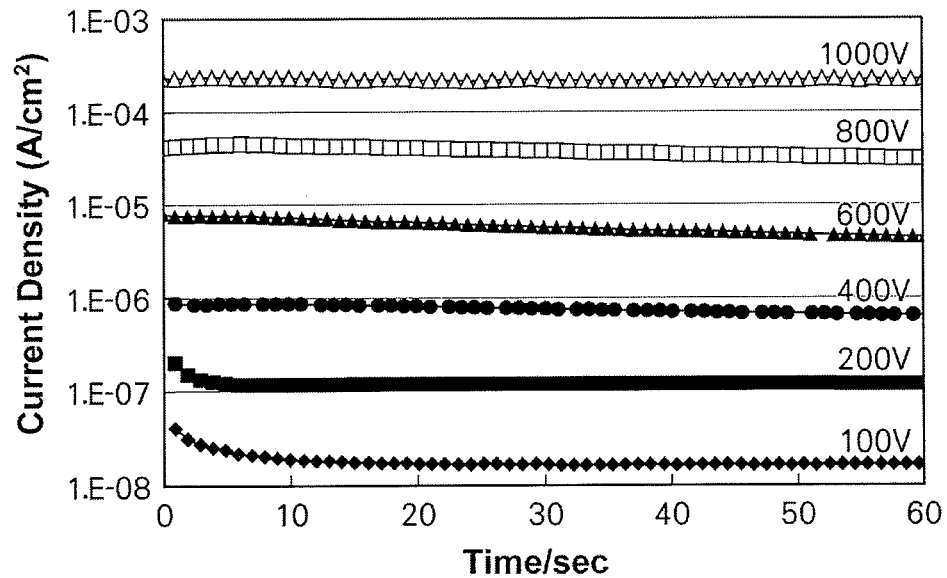
FIG. 5B is a graph showing transient electric current characteristics of the Al substrate of Example 1 having the positive polarity.

FIGS. 5A and 5B are graphs showing transient electric current characteristics of the Al substrate of Examples 1 when it had the negative polarity and when it had the positive polarity, respectively. The withstand voltage refers to a minimum voltage which does not cause breakdown even when the voltage is continuously applied. The leakage current density refers to a minute electric current flowing from a resistance per unit area of the insulating layer.

In the transient electric current characteristics shown in FIG. 5A, there is variation over time even when a voltage of 100 V was applied, and it is believed that local breakdown occurred at electrically weak portions of the barrier layer. Variation of the leakage electric current over time due to such local breakdown is not preferable, and this indicates high possibility of breakdown when the voltage is applied for a long time. Finally, breakdown of the entire sample occurred when a voltage of 300 V was applied. On the other hand, in the transient electric current characteristics shown in FIG. 5B, there is no significant variation of the leakage electric current, and no breakdown occurred even when a voltage of 1000 V was applied. The reason of this is probably that thick film growth of the barrier layer progresses with self-repairing defects in the barrier layer. Thus, it was proved that, when a voltage is applied so as to provide the Al substrate with the positive polarity, good insulation characteristics can be provided.

Figure 6A:
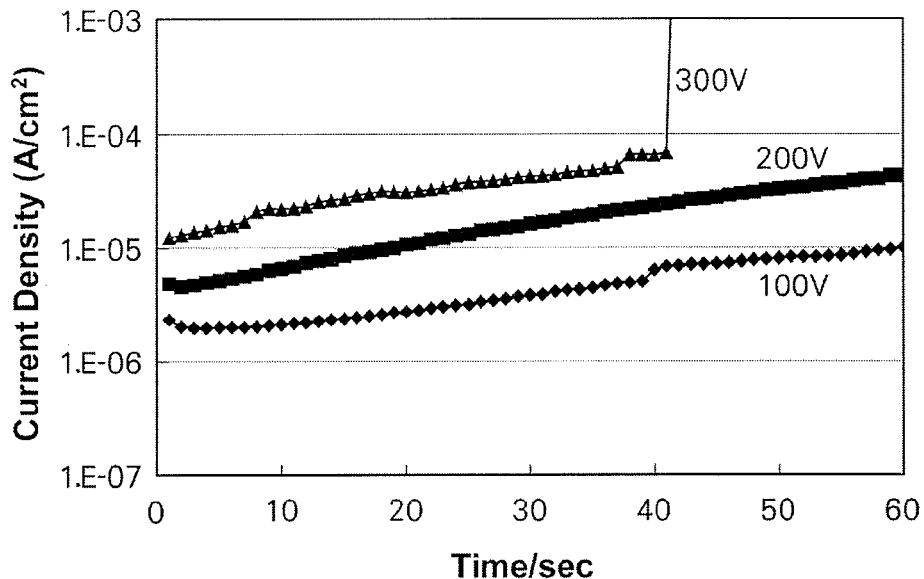
FIG. 6A is a graph showing transient electric current characteristics of an Al substrate of Example 2 having the negative polarity.
Figure 6B:
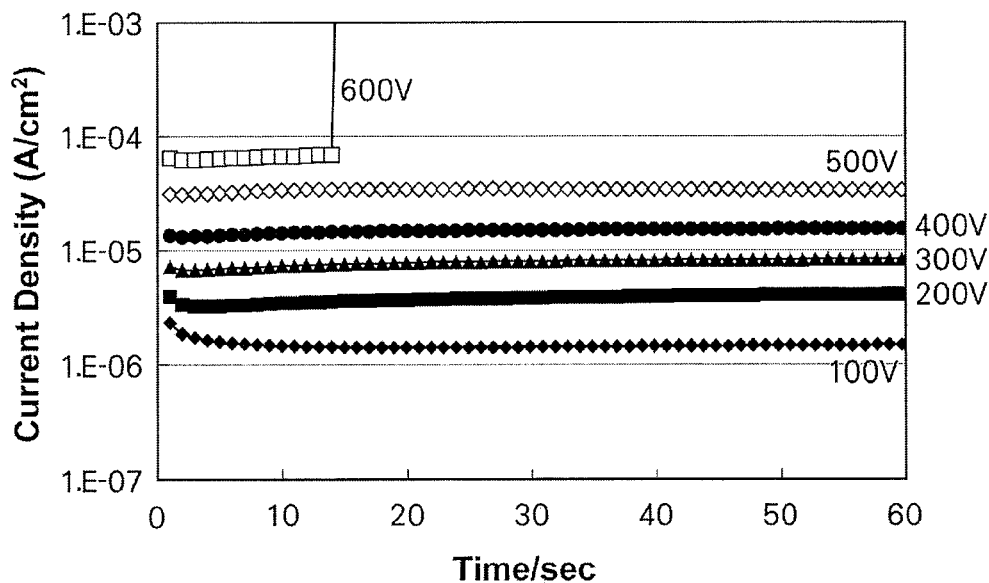
FIG. 6B is a graph showing transient electric current characteristics of the Al substrate of Example 2 having the positive polarity.

This tendency applies not only to the high-purity Al plate, but also to an industrial pure Al plate. FIGS. 6A and 6B show transient electric current characteristics of the Al substrate of Example 2 when it had the negative polarity and when it had the positive polarity, respectively. In the transient electric current characteristics shown in FIG. 6A, there is a tendency that the leakage electric current increases by about an order of magnitude over time, and this indicates high possibility of breakdown when the voltage is applied for a long time. Finally, similarly to Example 1, breakdown of the entire sample occurred when a voltage of 300 V was applied; however, it is highly possible that the withstand voltage was less than 100 V, as described above. On the other hand, as can be seen from the transient electric current characteristics shown in FIG. 6B, when a voltage was applied to provide the Al substrate of Example 2 with the positive polarity, low leakage electric current and high withstand voltage were provided, although they were not as good as those in Example 1. Thus, it was proved that the invention is also effective for the industrial Al plate.

The reason of the smaller withstand voltage in Example 2 using the industrial Al plate than that in Example 1 using the high-purity Al plate is believed to be that Si, which is an inevitable trace element contained in the industrial Al plate, is present in the form of metal Si as a minute foreign material in Al in the anodized film. The metal Si is not anodized during anodization of the industrial Al plate, and porous layers are present around the surfaces of the metal Si particles via the barrier layer. The reason of this is believed to be that, even when a voltage is applied to provide the industrial Al plate with the positive polarity, Al ions, which effect self-repairing of defects and thick film growth of the barrier layer, cannot easily be supplied to portions of the barrier layer on the surfaces of the metal Si particles, and thus local breakdown occurs and this often leads to breakdown of the entire sample.

The invention claimed is:

1. A semiconductor device comprising a semiconductor circuit on an insulated metal substrate, the insulated metal substrate including an anodized film formed on at least one side of an Al substrate,
   wherein the Al substrate is electrically connected to a site of the semiconductor circuit,
   wherein the semiconductor circuit is an integrated solar battery formed by a number of solar battery cells which are connected in series, and the Al base material is only connected to a single cell from among the number of cells, said connected site to a single cell having an electrical potential higher than the average electrical potential of the number of solar battery cells connected in series.

2. The semiconductor device as claimed in claim 1, wherein the electrically connected site of the Al substrate to the semiconductor circuit creates a short-circuit between the Al substrate and a site of the semiconductor circuit having a highest potential when the semiconductor circuit is driven.

3. The semiconductor device as claimed in claim 1, wherein a main component of a photoelectric conversion semiconductor of said solar battery is at least one compound semiconductor having a chalcopyrite structure.

4. The semiconductor device as claimed in claim 3, wherein the main component of the photoelectric conversion semiconductor is at least one compound semiconductor comprising a group Ib element, a group IIIb element and a group VIb element.

5. The semiconductor device as claimed in claim 3, wherein the main component of the photoelectric conversion semiconductor is at least one compound semiconductor comprising:
   at least one group Ib element selected from the group consisting of Cu and Ag;
   at least one group IIIb element selected from the group consisting of Al, Ga, and In; and
   at least one group VIb element selected from the group consisting of S, Se, and Te.

6. The semiconductor device as claimed in claim 1, wherein the Al base material is connected only to the positive electrode of the cell closest to a positive side, from among the solar battery cells.

* * * * *